US011977130B2

(12) United States Patent
Yan et al.

(10) Patent No.: US 11,977,130 B2
(45) Date of Patent: May 7, 2024

(54) CIRCUIT FOR ALTERNATING CURRENT AND DIRECT CURRENT LEAKAGE DETECTION

(71) Applicant: QINGDAO TOPSCOMM COMMUNICATION CO., LTD, Shandong (CN)

(72) Inventors: Chengwen Yan, Shandong (CN); Jianhua Wang, Shandong (CN); Zhen Liu, Shandong (CN)

(73) Assignee: QINGDAO TOPSCOMM COMMUNICATION CO., LTD, Shandong (CN)

( * ) Notice: Subject to any disclaimer, the term of this patent is extended or adjusted under 35 U.S.C. 154(b) by 0 days.

(21) Appl. No.: 17/767,892

(22) PCT Filed: Sep. 30, 2020

(86) PCT No.: PCT/CN2020/119325
§ 371 (c)(1),
(2) Date: Apr. 9, 2022

(87) PCT Pub. No.: WO2021/068833
PCT Pub. Date: Apr. 15, 2021

(65) Prior Publication Data
US 2024/0085495 A1    Mar. 14, 2024

(30) Foreign Application Priority Data

Oct. 9, 2019    (CN) .......................... 201910954730.8

(51) Int. Cl.
*G01R 31/52*    (2020.01)
(52) U.S. Cl.
CPC .................... *G01R 31/52* (2020.01)
(58) Field of Classification Search
CPC ........................................... G01R 31/52
(Continued)

(56) References Cited

U.S. PATENT DOCUMENTS

| 2014/0022686 | A1 | 1/2014 | Meisel et al. |
| 2018/0056802 | A1 | 3/2018 | Martel et al. |
| 2019/0331725 | A1* | 10/2019 | Ikushima ......... G01R 19/16538 |

FOREIGN PATENT DOCUMENTS

| CN | 201449415 U | 5/2010 |
| CN | 202486253 U | 10/2012 |

(Continued)

OTHER PUBLICATIONS

International Search Report for PCT/CN2020/119325 dated Dec. 25, 2020, ISA/CN.

(Continued)

*Primary Examiner* — Farhana A Hoque
(74) *Attorney, Agent, or Firm* — Yue (Robert) Xu; Apex Attorneys at Law, LLP

(57) ABSTRACT

A circuit for alternating current and direct current leakage detection. The circuit can achieve multiple functions such as direct current leakage detection, alternating current leakage detection, and leakage sampling link self-check. The circuit mainly comprises: an LDO module for converting an externally input power supply voltage into a voltage required for leakage detection; a frequency divider module for performing frequency division on a high-frequency clock signal; a logic control module for driving an MOS transistor and controlling the switching of different working modes; an MOS transistor driving module for driving an external leakage detection coil; a leakage detection coil for inducing alternating current and direct current leakage signals and a leakage self-check signal; a sampling resistor for converting the current signal flowing through the leakage detection coil into a voltage signal; a PGA module for amplifying a sampling signal; a gain control module for controlling a PGA amplification factor; an ADC module for performing digital-to-analog conversion of the signals; a DSP module for processing the alternating current and direct current (Continued)

leakage signals and the leakage self-check signal; and a current limiting module for limiting a loop current.

9 Claims, 2 Drawing Sheets

(58) Field of Classification Search
USPC .......................................................... 324/555
See application file for complete search history.

(56) References Cited

FOREIGN PATENT DOCUMENTS

| | | |
|---|---|---|
| CN | 106443305 A | 2/2017 |
| CN | 110036303 A | 7/2019 |
| CN | 110531211 A | 12/2019 |
| DE | 102019202474 A1 | 9/2019 |
| EP | 3242369 A1 | 11/2017 |
| JP | 2017188681 A | 10/2017 |

OTHER PUBLICATIONS

Search Report dated Oct. 14, 2022 for European patent application No. 20875192.5.

* cited by examiner

CIRCUIT FOR ALTERNATING CURRENT AND DIRECT CURRENT LEAKAGE DETECTION

CROSS REFERENCE OF RELATED APPLICATION

The present application is the national phase application of International Patent Application No. PCT/CN2020/119325, titled "CIRCUIT FOR ALTERNATING CURRENT AND DIRECT CURRENT LEAKAGE DETECTION", filed on Sep. 30, 2020, which claims priority to Chinese Patent Application No. 201910954730.8, titled "CIRCUIT FOR ALTERNATING CURRENT AND DIRECT CURRENT LEAKAGE DETECTION SYSTEM", filed on Oct. 9, 2019 with the China National Intellectual Property Administration, both of which are incorporated herein by reference in their entireties.

FIELD

The present disclosure relates to the technical field of leakage current detection and protection circuits, and in particular, to a circuit for detecting an AC leakage current and a DC leakage current.

BACKGROUND

A residual current operated protective device (Residual Current Device, RCD) is a widely used safety protection device, and is used to prevent personal electric shock, electrical fire, electrical apparatus damage and so on. According to different types of detection current, the RCD is classified as an AC-type RCD for detecting an alternating current (AC) current, an A-type RCD for detecting the AC current and a pulsating direct current (DC) current, a B-type RCD for detecting the AC current, the pulsating DC current and a smooth DC current, and a B$^+$-type RCD for detecting the AC current, a high-frequency current, the pulsating DC current and the smooth DC current.

Currently, the AC-type RCD and the A-type RCD are widely used in the domestic market. The B-type RCD and the B$^+$-type RCD are not well developed due to the limited application scenarios. In recent years, with the rapid development of electric vehicles, frequency converters, new energy and other technical fields, types of residual current become more complex when a leakage faults occur in a system. The residual current includes the smooth DC current, a high-frequency AC current, a current with multi-frequency composite wave and so on rather than a simple sinusoidal AC current or the pulsating DC current. Therefore, the research on the B$^+$-type RCD is becoming more critical.

Currently, a common technology for detecting a leakage current cannot completely detect the DC leakage current and an AC leakage current with high-frequency kHz, and the circuit has relatively low accuracy and sensitivity, a relatively complex structure and a relatively high cost.

During DC leakage current detection by means of magnetic modulation, it is required to excite a leakage current detection coil utilizing a positive excitation square wave and a negative excitation square wave, so that the leakage current detection coil is in a bidirectional saturation zone. In such case, the signal can fully reflect different zones of a hysteresis loop. It is determined whether there is a DC leakage current by detecting a time change of reaching saturation ampere turns. During AC leakage current detection by means of electromagnetic induction, an AC leakage current from power frequency to high-frequency kHz can be detected. The residual current can completely be detected by controlling an operation state to be switched.

SUMMARY

A circuit for detecting an AC leakage current and a DC leakage current with high sensitivity, high precision is provided according to the present disclosure, which can completely detect a DC leakage current and an AC leakage current with high-frequency kHz. The circuit can sample and process a DC leakage signal, an AC leakage signal and a leakage self-inspection signal.

To achieve the above objects, the circuit for detecting an AC leakage current and a DC leakage current according to the present disclosure includes an low dropout regulator (LDO) module, a frequency division module, a logic control module, a Metal-Oxide-Semiconductor (MOS) transistor driving module, a leakage current detection coil, a sampling resistor, a programmable gain amplifier (PGA), a gain control module, an analog-to-digital conversion (ADC) module, a digital signal process (DSP), and a current limiting module.

The LDO module is configured to convert an input power supply voltage into a voltage for driving the leakage current detection coil, and isolate the circuit from another module to avoid a voltage fluctuation of the module affecting the circuit, to improve detection accuracy. The frequency division module is configured to divide a frequency of a high-frequency clock signal, to control a frequency of an excitation square wave. The logic control module is configured to drive a MOS transistor and control switching of different operation modes. The MOS transistor driving module is configured to drive an external leakage current detection coil. The leakage current detection coil is configured to induce an AC leakage signal, a DC leakage signal, and a leakage self-inspection signal. The sampling resistor is configured to convert a current signal flowing through the leakage current detection coil into a voltage signal. The PGA module is configured to amplify a sampled signal. The gain control module is configured to control a magnification of the PGA module. The ADC module is configured to convert conversion of an amplified sampled signal from digital to analog. The DSP module is configured to process the AC leakage signal, the DC leakage signal, and the leakage current self-inspection signal. The current limiting module, is configured to limit a current flowing through the leakage current detection coil.

The circuit according to the present disclosure includes three functional modules for DC leakage current detection, AC leakage current detection and self-inspection detection. The circuits between the functional modules are mostly reused, so that a structure of the circuit is simple. The above three functions may be achieved by using one leakage current detection coil, so that application cost is low.

During DC leakage current detection by means of magnetic modulation, it is required to excite a leakage current detection coil utilizing a positive excitation square wave and a negative excitation square wave, so that the leakage current detection coil is in a bidirectional saturation zone. Since the DSP cannot output positive and negative square wave signals and the DSP has limited driving capacity, an H-bridge formed by MOS transistors is used to provide the positive and negative excitation square wave signals to the leakage current detection coil during the DC leakage current detection, so that the leakage current detection coil is in the bidirectional saturation zone.

During AC leakage current detection, the excitation square wave is turned off, and the sampling resistor and the leakage current detection coil form a loop to detect the AC signal by means of electromagnetic induction.

During leakage current self-inspection, an intermediate self-inspection tap of the leakage current detection coil is grounded through a current limiting resistor, and the positive and negative excitation square wave signals are transmitted into the leakage current detection coil, and a self-inspection signal is generated on the sampling resistor by means of inductive shunt.

DETAILED DESCRIPTION

A principle of a circuit for detecting an AC leakage current and a DC leakage current and a method for detecting a residual current according to the present disclosure are described below in combination with FIGS. 1 and 2.

Figure 1:
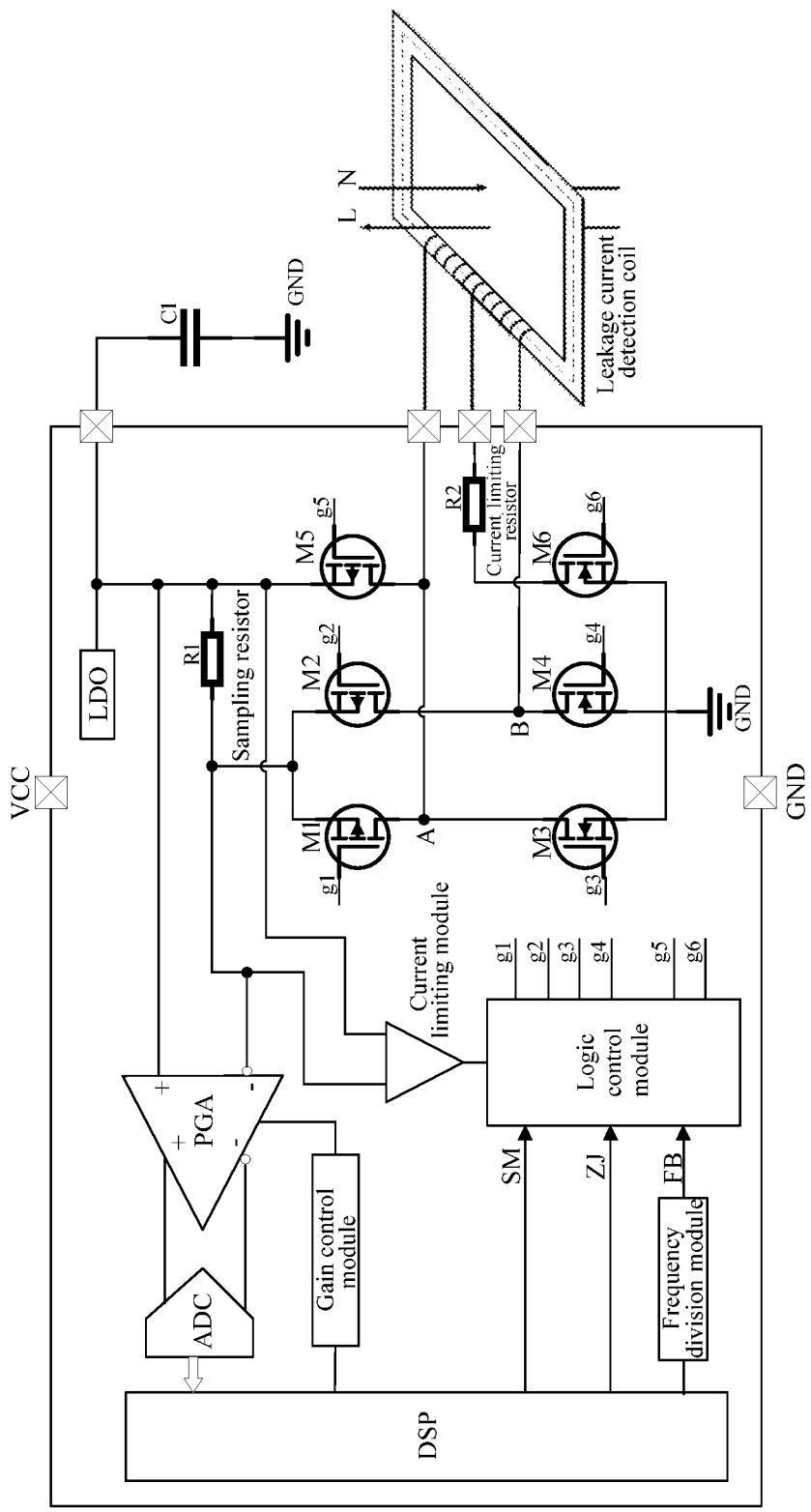
FIG. 1 is a diagram showing a circuit for detecting an AC leakage current and a DC leakage current according to the present disclosure.

FIG. 1 is a diagram showing a circuit for detecting an AC leakage current and a DC leakage current according to an embodiment. L represents a live wire and N represents a neutral wire. The circuit mainly includes an low dropout regulator (LDO) module, a frequency division module, a logic control module, a Metal-Oxide-Semiconductor (MOS) transistor driving module, a leakage current detection coil, a sampling resistor, a programmable gain amplifier (PGA), a gain control module, an analog-to-digital conversion (ADC) module, a digital signal process (DSP), a current limiting module and other modules.

The LDO module is configured to convert an input power supply voltage into a voltage for driving the leakage current detection coil, and isolate the circuit from another module to avoid a voltage fluctuation of the module affecting the circuit. During DC leakage current detection, a time period for the coil charging to a saturation zone changes with the change of an amplitude of a driving voltage of the leakage current detection coil, resulting in affecting detection accuracy. Therefore, a stable voltage is required. The voltage can ensure that the leakage current detection coil is in the saturation zone during the DC leakage current detection.

The frequency division module is configured to divide a frequency of a high-frequency clock signal provided by the DSP or an external crystal oscillator, to control a frequency of an excitation square wave. Since the number of turns of the leakage current detection coil and a magnetic core affect a time period when the coil reaches a bidirectional saturation zone, the frequency of the excitation square wave may be configured by software to improve flexibility of the circuit.

The main function of the logic control module is to:
1) convert a square wave signal level outputted by the frequency division module into a level for controlling a MOS transistor to be turned on or off;
2) control a MOS transistor M1 and a MOS transistor M3 to be not turned on simultaneously, and a MOS transistor M2 and a MOS transistor M4 to be not turned on simultaneously;
3) control timing of a driving voltage of the MOS transistor module, where both a SM signal, a ZJ signal and a FB signal control timing of an output level of the logic control module and an operation mode (such as DC leakage current detection, AC leakage current detection or self-inspection) of the circuit; and
4) control an output voltage of a pin g3 and an output voltage of a pin g4 according to an output signal of the current limiting module and a preset value, so as to control a voltage between a gate and a source of the MOS transistor M3 and a voltage between a gate and a source of the MOS transistor M4, thereby limiting a current.

The MOS transistor driving module includes six MOS transistors including MOS transistors M1 to M6.

During the DC leakage current detection, the MOS transistors M5 and M6 are turned off, and the MOS transistors M1 to M4 form an H full-bridge. When the MOS transistors M1 and M4 are turned on, current passing the leakage current detection coil flows through the sampling resistor, a connection point A and a connection point B to the ground GND sequentially. When the MOS transistors M2 and M3 are turned on, current passing the leakage current detection coil flows through the sampling resistor, the connection point B, the connection point A, to the ground GND sequentially, so as to provide positive and negative excitation square waves for the leakage current detection coil.

During the AC leakage current detection, the MOS transistors M5 and M2 are turned on, and MOS transistors M1, M3, M4 and M6 are turned off. In such case, the leakage current detection coil operates in an electromagnetic induction state, and induced current flows through the MOS transistor M2, the MOS transistor M5, the sampling resistor to the ground GND.

During the leakage current self-inspection, the MOS transistor M5 is turned off and the MOS transistor M6 is turned on, and a half-bridge formed by the MOS transistors M1 and M4 and a half-bridge formed by the MOS transistors M2 and M3 are turned on cyclically. The leakage current detection coil generates a self-inspection signal on the sampling resistor by means of inductive shunt.

Figure 2:
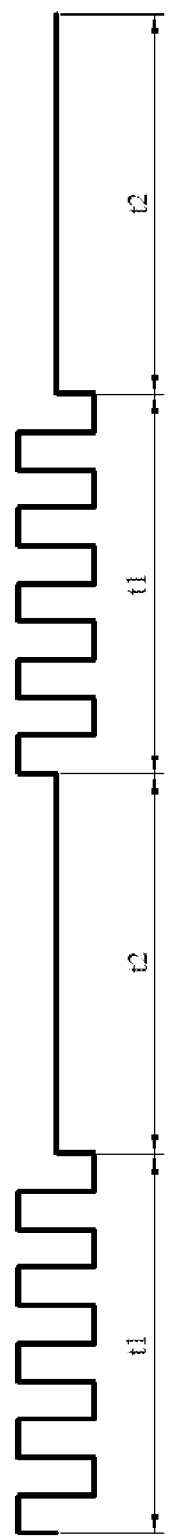
FIG. 2 is a diagram showing principles for detecting a DC leakage current and an AC leakage current by time-sharing multiplexing according to the present disclosure.

FIG. 2 is a diagram showing principles for detecting a DC leakage current and an AC leakage current by time-sharing multiplexing according to the present disclosure. A time period t1 is used for detecting a DC leakage current. During the time period, positive and negative excitation square waves are transmitted into the leakage current detection coil, so that a magnetic hysteresis loop of the leakage current detection coil switches back and forth in the bidirectional saturation zone. It is determined whether there is a DC leakage current by detecting a time change of reaching saturation ampere turns. A time period t2 is used for detecting an AC leakage current. During the time period, a voltage of the excitation square wave is zero, and the magnetic core operates in a linear zone. It is determined whether there is an AC leakage current by means of electromagnetic induction.

The leakage current detection coil is configured to detect a residual current between the neutral wire and the live wire, and perform self-inspection on a leakage current detection link through an intermediate self-inspection tap.

Resistance of the sampling resistor cannot be too large, so as to prevent the magnetic core from entering the saturation zone caused by a large voltage at both terminals of the sampling resistor when it is determined whether there is an AC leakage current by means of electromagnetic induction. The resistance of the sampling resistor cannot be too small to ensure detection accuracy of a leakage signal.

The PGA module is configured to amplify a voltage signal at both terminals of the sampling resistor. A magnification of the programmable gain amplifier module may be configured by software to improve the flexibility of the circuit.

The gain control module is configured to control the magnification of the PGA module in real time. During the DC leakage current detection, due to a large variation range of a signal level of the sampling resistor, it is required to control the magnification of PGA module in real time according to amplitude of a sampled signal in each sampling cycle, to improve the detection accuracy and make full use of an input voltage range of the ADC module.

The ADC module is configured to convert a signal amplified by the PGA module from analog to digital.

The DSP module is configured to process the sampled signal, control the magnification of PGA module, control the operation mode of the logic control module, and respectively process a DC leakage signal, an AC leakage signal and a leakage current self-inspection signal by different algorithms according to different operation modes of the MOS transistor driving module.

The current limiting module is configured to limit the current flowing through the leakage current detection coil. During the DC leakage current detection, in a case that the magnetic core is in the saturation zone when a current reaches a value, if the current continues to increase, sampling accuracy of the leakage signal is affected and power consumption increases, and thus it is required to limit the current flowing through the leakage current detection coil. In a case that it is detected that the current flowing through the leakage current detection coil is greater than the preset value, the logic control module controls the output voltage of the pin g3 and the output voltage of the pin g4, so as to control the voltage between the gate and the source of the MOS transistor M3 and the voltage between the gate and the source of the MOS transistor M4, thereby limiting the current.

The foregoing are merely preferred embodiments of the present disclosure, and those skilled in the art can make various modifications and variations without deviating from the principle of the present disclosure. Any modifications, equivalent substitutions and improvements made within the spirit and the principle of the present disclosure should fall within the protection scope of the present disclosure.

The invention claimed is:

1. A circuit for detecting an alternating current (AC) leakage current and a direct current (DC) leakage current, comprising:
an low dropout regulator (LDO) module, configured to convert an external input power supply voltage into a voltage for detecting a leakage current;
a frequency division module, configured to divide a frequency of a high-frequency clock signal;
a logic control module, configured to drive a Metal-Oxide-Semiconductor (MOS) transistor and control switching of different operation modes;
a MOS transistor driving module, configured to drive an external leakage current detection coil;
a leakage current detection coil, configured to induce an AC leakage signal, a DC leakage signal, and a leakage current self-inspection signal;
a sampling resistor, configured to convert a current signal flowing through the leakage current detection coil into a voltage signal;
a programmable gain amplifier (PGA) module, configured to amplify a sampled signal;
a gain control module, configured to control a magnification of the PGA module;
an analog-to-digital conversion (ADC) module, configured to convert conversion of an amplified sampled signal from digital to analog;
a digital signal process (DSP) module, configured to process the AC leakage signal, the DC leakage signal, and the leakage current self-inspection signal; and
a current limiting module, configured to limit a current flowing through the leakage current detection coil;
wherein the logic control module is configured to drive the MOS transistor and control switching of different operation modes, during DC leakage current detection, the logic control module controls four MOS transistors M1 to M4 to be turned on cyclically according to a square wave signal with a frequency inputted by a control signal FB; during AC leakage current detection, the logic control module controls MOS transistors M5 and M2 to be turned on and MOS transistors M1, M3, M4 and M6 to be turned off according to an active level of a control signal SM; and during self-inspection, the MOS transistor M6 is turned on, the MOS transistor M5 is turned off, and the MOS transistors M1 to M4 are turned on cyclically according to an active level of a control signal ZJ, and a leakage self-inspection signal is generated on the sampling resistor by means of inductive shunt;
wherein the logic control module is further configured to control logic of driving signal g1 to g4 of gates of the MOS transistors is configured to ensure that the MOS transistors M1 and M3 are not turned on simultaneously, and the MOS transistors M2 and M4 are not turned on simultaneously;
wherein the MOS transistor driving module comprises six MOS transistors comprising MOS transistors M1 to M6, and is configured to drive the leakage current detection coil; the logic control module drives the six MOS transistors to be turned on or off;
wherein during the DC leakage current detection, the MOS transistors M1 to M4 form an H-bridge driving circuit, to generate a positive square wave and a negative square wave for driving the leakage current detection coil, and the MOS transistors M5 and M6 are turned off; during the AC leakage current detection, the MOS transistors M2 and M5 are turned on, the MOS transistors M1, M3, M4 and M6 are turned off, and the leakage current detection coil detects an alternating residual current between a neutral wire and a live wire by means of electromagnetic induction, to generate a voltage drop on the sampling resistor R1; and during self-inspection, the MOS transistors M1-M4 are turned on cyclically, the MOS transistor M6 is turned on and the MOS transistor M5 is turned off, the leakage current detection coil generates a self-inspection signal by means of inductive shunt to detect whether a leakage current detection link is good.

2. The circuit according to claim 1, wherein
the frequency division module is configured to divide the frequency of the high-frequency clock signal, to control a frequency of an excitation square wave of the leakage current detection coil, and the frequency of the excitation square wave is configured by software to improve flexibility of the circuit.

3. The circuit according to claim 1, wherein
the leakage current detection coil is configured to detect a residual current between a neutral wire and a live wire, and perform self-inspection on a leakage current detection link through an intermediate self-inspection tap.

4. The circuit according to claim 1, wherein the LDO module is configured to convert an input power supply voltage into a voltage for driving the leakage current detection coil, and isolate the circuit from another module to avoid a voltage fluctuation of the module affecting the circuit.

5. The circuit according to claim 1, wherein the PGA module is configured to amplify a voltage signal at both terminals of the sampling resistor, and a magnification of the PGA module is configured by software to improve flexibility of the circuit.

6. The circuit according to claim 1, wherein the gain control module is configured to control the magnification of the PGA module in real time.

7. The circuit according to claim 1, wherein the ADC module is configured to convert a signal amplified by the PGA module from analog to digital.

8. The circuit according to claim 1, wherein the DSP module is configured to process the sampled signal, and respectively process the DC leakage signal, the AC leakage signal and the leakage current self-inspection signal by different algorithms according to different operation modes of the MOS transistor driving module.

9. The circuit according to claim 1, wherein the current limiting module is configured to limit the current flowing through the leakage current detection coil.

* * * * *